United States Patent
Archambeault et al.

(10) Patent No.: US 7,848,108 B1
(45) Date of Patent: Dec. 7, 2010

(54) HEATSINK WITH PERIODICALLY PATTERNED BASEPLATE STRUCTURE

(75) Inventors: Bruce R. Archambeault, Four Oaks, NC (US); Eric N. Chikando, Cary, NC (US); Samuel R. Connor, Durham, NC (US); John S. Maas, Kasson, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/536,655

(22) Filed: Aug. 6, 2009

(51) Int. Cl.
*H05K 7/20* (2006.01)

(52) U.S. Cl. .................. 361/719; 361/704; 165/80.3; 165/185

(58) Field of Classification Search .................. None
See application file for complete search history.

(56) References Cited

U.S. PATENT DOCUMENTS

| | | | |
|---|---|---|---|
| 6,437,438 B1 * | 8/2002 | Braasch | 257/712 |
| 6,563,198 B1 * | 5/2003 | Caldwell | 257/659 |
| 6,947,294 B2 * | 9/2005 | Lin et al. | 361/818 |
| 7,405,698 B2 | 7/2008 | de Rochemont | |
| 7,463,213 B2 | 12/2008 | Nakano et al. | |
| 7,748,440 B2 * | 7/2010 | Michel et al. | 165/185 |
| 2008/0303121 A1 | 12/2008 | Lin et al. | |

OTHER PUBLICATIONS

Doctoral Thesis by: Felix Djebe Mbairi, "Some Aspects of Advanced Technologies and Signal Integrity Issues in High Frequency PCTs, With Emphasis on Planar Transmission Lines and RF/Microwave Filters", Stockholm, 2007 Sweden, pp. 1-96.

* cited by examiner

*Primary Examiner*—Boris L Chervinsky
(74) *Attorney, Agent, or Firm*—Cynthia G. Seal; Jeffrey L. Streets

(57) ABSTRACT

A heatsink including an electromagnetic bandgap structure reduces electromagnetic interference caused by an integrated circuit in an electronic device. One embodiment provides a heatsink having a base with an array of electrically-conductive, thermally-conductive patches spaced apart in two dimensions of a reference plane and having a thickness perpendicular to the reference plane. The patches are interconnected by a plurality of branches. Each branch connects adjacent patches and has a width in the reference plane of less than a width of each adjacent patch. A plurality of thermally conductive cooling fins coupled to a surface of the base and extend normal to the reference plane. The cooling fins may be formed of a thermally-conductive, electrically non-conductive material or may be coupled to the base by a thermally-conductive, electrically non-conductive material. The periodically patterned structure of the base, together with a solid metal layer of a circuit board, form an electromagnetic bandgap structure that reduces certain frequencies of electromagnetic noise caused by the integrated circuit.

20 Claims, 6 Drawing Sheets

US 7,848,108 B1

HEATSINK WITH PERIODICALLY PATTERNED BASEPLATE STRUCTURE

BACKGROUND OF THE INVENTION

1. Field of the Invention

The present invention relates to reducing the propagation of electromagnetic interference, particularly in the context of heatsinks for integrated circuits.

2. Background of the Related Art

Electromagnetic interference (EMI) is a disturbance that affects an electrical circuit due to electromagnetic radiation. The disturbance may interrupt, obstruct, or otherwise degrade or limit the effective performance of the circuit. Undesirable electromagnetic radiation often originates in integrated circuits (ICs), and is radiated by other structures at a level sufficient to cause interference with other components. A heatsink can be particularly problematic. Due to its large, metallic surface area, a heatsink may serve as an efficient antenna for propagating electromagnetic radiation.

Numerous approaches to reducing EMI are known in the art. One approach to reducing EMI is the use of bypass or "decoupling" capacitors on each active device. The decoupling capacitors are connected across the power supply, as close to the device as possible. Another known approach to reducing noise is to control the rise time of high-speed signals. The rise time may be controlled, for example, using series resistors. VCC filtering may also be used to reduce the amount of radio frequency interference spread via power supply connections. Shielding may be used, at the expense of adding additional components such as RF gaskets.

As a result of integrated circuit clock and data speeds increasing to beyond 1 GHz, the wavelength of the radiation emitted from an IC is on a similar order of magnitude as the physical dimensions of the IC heatsinks. This contributes to the efficiency of the heatsink acting as an antenna for noise on the IC/IC package. Heatsink grounding schemes exist that attempt to address the problem, but these workarounds add cost to a printed circuit board assembly and also consume a substantial portion of the limited space on a circuit board.

BRIEF SUMMARY OF THE INVENTION

A first embodiment of the present invention is a heatsink that includes a base having a periodically patterned structure comprising an array of electrically-conductive, thermally-conductive patches spaced apart in two dimensions of a reference plane and having a thickness perpendicular to the reference plane. A plurality of branches structurally connects the patches. Each branch connects adjacent patches and has a width in the reference plane of less than a width of each adjacent patch. A plurality of thermally conductive cooling fins is coupled to the base and extends normal to the reference plane.

A second embodiment is an apparatus having a printed circuit board including a continuous, electrically-conductive layer. A processor is physically coupled to the printed circuit board and is electrically coupled to the electrically-conductive layer. A heatsink is coupled to the circuit board in thermal contact with the processor. The heatsink includes a base having a periodically patterned structure comprising an array of electrically-conductive, thermally-conductive patches spaced apart parallel to the conductive layer and having a thickness perpendicular to the conductive layer. A plurality of branches structurally connects the patches. Each branch spans an opening between two adjacent patches and has a width in the reference plane of less than a width of each adjacent patch. A plurality of thermally conductive cooling fins is coupled to the base and extends perpendicular to the reference plane.

A third embodiment is a method of reducing the propagation of electromagnetic noise generated by a microprocessor. A frequency band of the electromagnetic noise generated by the microprocessor is identified. A periodic pattern of spaced apart patches interconnected by branches is selected, with geometry having stopband within the identified frequency band. The processor is thermally contacted with a heatsink having a base that includes an electrically-conductive, thermally-conductive material having the selected periodic pattern.

DETAILED DESCRIPTION OF THE INVENTION

Embodiments of the invention are directed to reducing electromagnetic interference (EMI) caused by an integrated circuit (IC) in an electronic device. One embodiment is a heatsink for an IC incorporating a periodically patterned structure within the base of the heatsink. The periodically patterned structure, together with a solid metal layer of a circuit board (e.g. ground layer or power layer), form an electromagnetic bandgap (EBG) structure that reduces the efficiency of the heatsink acting as an antenna in certain frequency bands. The periodically patterned structure includes a periodic array of electrically-conductive patches interconnected by electrically-conductive branches. Openings in the periodically-patterned structure are filled with a thermally-conductive but electrically non-conductive filler, which maximizes heat transfer within the heatsink without undermining the electrical properties of the EBG structure. Heatsink fins are coupled to the heatsink base using a thermally-conductive but electrically non-conductive binder, which maximizes heat transfer from the heatsink base to the fins while electrically insulating the fins from the heatsink base. The physical parameters of the periodically patterned structure may be selected to diminish the propagation of electromagnetic waves in one or more characteristic bands. The heatsink provides this noise reduction but with a level of heat dissipation and affordability comparable to that of a conventional heatsink.

Various materials described herein are identified as being either electrically conductive or electrically non-conductive, and either as thermally conductive or non-conductive, as the case may be. While virtually every material can conduct heat and electricity to at least some limited degree and under certain circumstances, some materials do not conduct electricity sufficiently well to be regarded as electrical conductors for the purpose of the invention. Likewise, some materials do not conduct heat well enough to be regarded as thermal conductors for the purpose of the invention. Thus, in the context of the invention, a material is considered to be electrically conductive if it has an electrical conductivity coefficient of at least about $10^7$ S/m and thermally conductive if it has a thermal conductivity coefficient of at least about 1 W/m*K. Although explicitly defined here for clarity, these definitions of thermal and electrical conductivity are consistent with working definitions known to those having an ordinary level of skill in the art.

Figure 1:
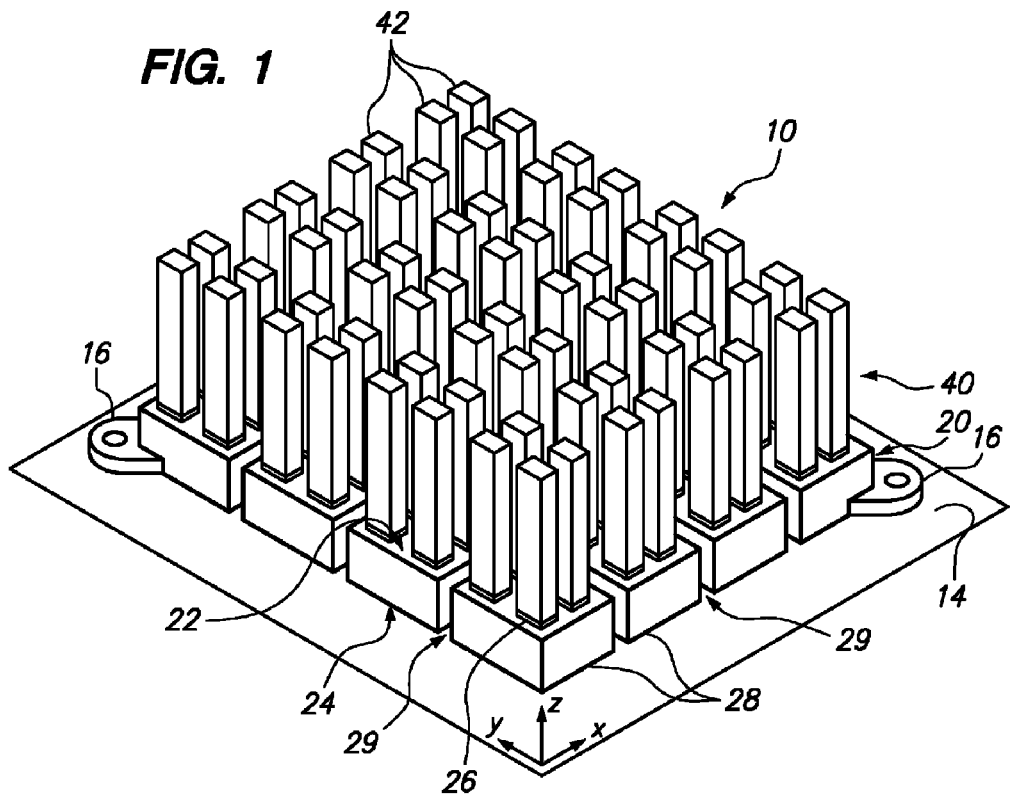
FIG. 1 is a perspective view of a heatsink according to an embodiment of the invention.

FIG. 1 is a perspective view of a heatsink 10 according to an embodiment of the invention. The heatsink 10 includes a heatsink base 20 having a periodically-patterned structure and a cooling fin structure 40 coupled to the heatsink base 20. Mounting tabs 16 are provided for mounting the heatsink 10 to a circuit board (not shown) or otherwise securing the heatsink in thermal communication with a heat generating component, such as an integrated circuit. A continuous, electrically-conductive circuit board layer 14 is also illustrated, with the rest of the circuit board omitted for clarity. The continuous, electrically-conductive layer 14 is a very thin, usually metallic layer of the circuit board, such as either a ground plane or power plane of the circuit board, and is alternately referred to herein as the metal layer 14. Together, the periodically patterned heatsink base 20 and the metal layer 14 collectively form an EBG structure that will be described further below.

The metal layer 14 also defines a convenient reference plane for describing certain physical features of the heatsink 10. A first surface 22 and an opposing second surface 24 of the heatsink base 20 are both parallel to the metal layer 14. With respect to this particular embodiment, the first and second surfaces 22, 24 will be referred to as the upper surface 22 and the lower surface 24 of the heatsink base 20. Rectangular coordinates (x,y,z) are also provided in FIG. 1 for reference. The "x" and "y" axes represent two dimensions of the reference plane defined by the metal layer 14. The "z" axis is perpendicular to the x- and y-axes and is normal to the metal layer 14.

The periodically-patterned heatsink base 20 includes a plurality of spaced-apart patches 28 interconnected by branches 30 (see FIG. 2), defining various openings 29 between the patches 28. The patches are spaced above the reference plane in the z-direction and spaced-apart from each other in the x- and y-directions. The patches 28 and the branches 30 share the opposing planar upper and lower surfaces 22, 24 of the heatsink base 20. The patches 28 are formed of an electrically-conductive and thermally-conductive material. Copper is just one example of an electrically-conductive and thermally-conductive material suitable for forming the patches 28.

The cooling fin structure 40 includes a plurality of prong-type cooling fins 42 coupled to the heatsink base 20. The cooling fins 42 are oriented in the z-direction, i.e., extending normal to the metal layer 14. Although other types of cooling fins may alternatively be used, the prong-type cooling fins 42 in this embodiment allow the cooling fins 42 to be arranged along the upper surface 22 of the heatsink base 20 without any of the cooling fins 42 extending laterally across one of the openings 29 between adjacent patches 28. The cooling fins 42, like the patches 28 of the heatsink base, are formed of a thermally-conductive material, such as copper or aluminum. The cooling fins 42 are coupled to the upper surface 22 of the heatsink base 20 by a thermally-conductive but electrically non-conductive binder 26. Thus, heat is efficiently transferred through the binder 26 from the heatsink base 20 to the fins 42, but the cooling fins 42 are electrically insulated by the binder 26 from the heatsink base 20.

One example of a material that may be suitable for the thermally-conductive, electrically non-conductive binder 26 is an epoxy composite. A component of the epoxy composite may be selected to achieve a desired thermal conductivity but with a low enough electrical conductivity to be considered electrically non-conductive. Thus, the epoxy composite may both reliably secure the cooling fins 42 to the heatsink base 20 and electrically insulate the cooling fins 42 from the heatsink base 20. One specific example of a suitable component for providing thermal conductivity to the epoxy composite is boron nitride, which typically has an electrical conductivity of about 600 W/m*K.

In another embodiment, the thermally-conductive, electrically non-conductive binder may be omitted, and the cooling fins 42 may instead be formed from a thermally-conductive, electrically non-conductive material. For example, the cooling fins could be made of graphite, which has a thermal conductivity of between about 25 and 470 W/m*K and an electrical conductivity of about 50000 S/m.

The number of cooling fins may vary from embodiment to embodiment, according to the size of the heatsink, the desired surface area required for cooling in a specific application, the available space on a motherboard and within a computer enclosure, and so forth. The cooling fins 42 in this embodiment are grouped, by way of example, in groups of four cooling fins 42 per patch 28. The number of cooling fins 42 and the length of the cooling fins 42 are selected to provide ample surface area for cooling. Heat transferred from the heatsink base 20 to the cooling fins 42 may be efficiently removed by air, usually by forced convection but optionally by natural convection.

Figure 2A:
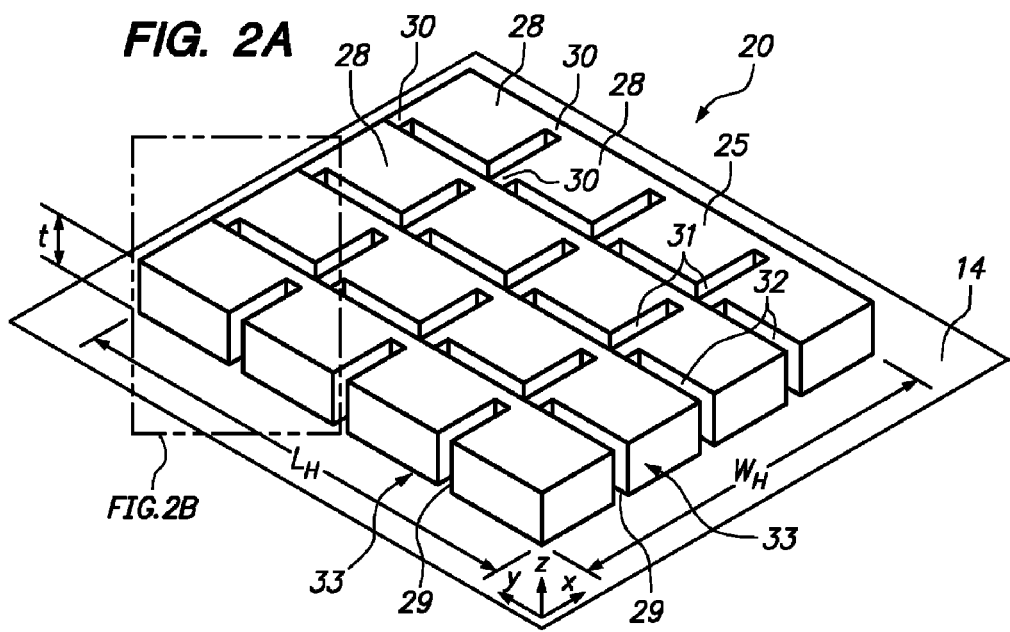
FIGS. 2A-B are perspective views of the heatsink base further detailing the periodically patterned structure of the heatsink base.

FIG. 2A is a perspective view of the heatsink base 20 further detailing one embodiment of the periodically patterned structure of the heatsink base 20. The cooling fins 42 of FIG. 1 are removed from view to show the array of spaced-apart, electrically-conductive, thermally-conductive patches 28, as interconnected by branches 30. The patches 28 are arranged in a rectangular array of, by way of example, four rows and four columns. The array of patches 28 may optionally be evenly-spaced in the x- and y-directions. Each branch 30 connects a particular pair of adjacent patches 28. Openings in the periodically patterned structure are generally indicated at 29, between the spaced-apart patches 28 and the branches 30 connecting the patches 28. The openings 29 include, more specifically, interior, L-shaped slots 31, and exterior, open slots 32 along two outer edges 33 of the heatsink base 20.

The patches 28 and branches 30 are electrically and thermally conductive. Thus, electrons can freely flow throughout the heatsink base 20, and flow freely through the branches 30 from one patch 28 to another patch 28. The branches 30 and patches 28 may be formed of the same material, and may even be formed as a unitary member, such as if the heatsink base 20 were formed from a single block of material (e.g. copper) by removing some of the material, for example through machining, cutting or etching, to achieve the desired pattern of patches 28 and branches 30. In this embodiment, a cross-section 25 of the periodically-patterned structure taken parallel to the metal layer 14 may be substantially constant in a direction perpendicular to the reference plane. That is, the cross-section may be generally constant in the z-direction except for variations within typical manufacturing tolerances. The heatsink base 20 has an overall heatsink length ($L_H$) and an overall width ($W_H$), which in this embodiment are equal. The heatsink base 20 also has a uniform thickness (t).

Together, the metal layer 14 and the periodically patterned heatsink base 20 form an electromagnetic bandgap structure having a characteristic stopband. The stopband is largely a function of the geometry of the periodically patterned structure, including the overall dimensions of the heatsink base 20 and the shape and dimensions of the patches 28 and branches 30. Because the heatsink base 20 has a uniform thickness, each patch 28 and branch 30 have the same thickness "t."

Figure 2B:
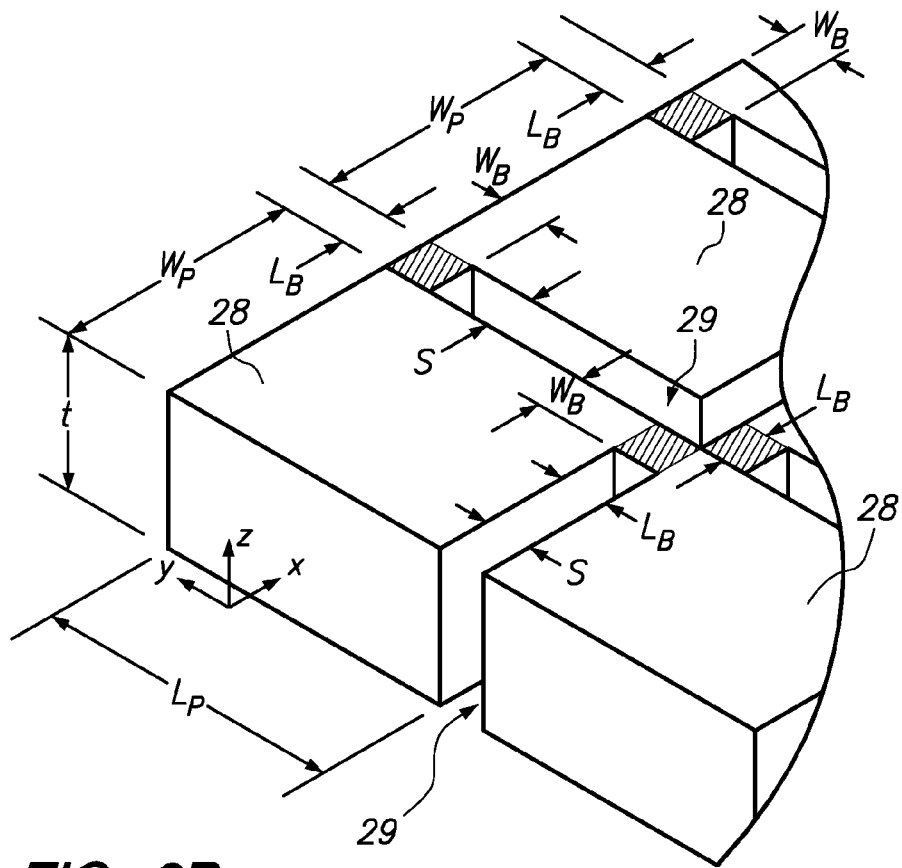

FIG. 2B is an enlarged perspective view of a portion of the heatsink base 20, further detailing the geometry of the patches 28 and branches 30. In this embodiment, the patches 28 are all the same size such that each patch 28 has a patch length ($L_P$) in the same direction as the length ($L_H$) of the heatsink base 20, and a patch width ($W_P$) in the same direction as the width ($W_H$) of the heatsink base 20. Although not required, the patches 28 may be square, so that the patch width equals the patch length ($W_P=L_P$). The top surface of the branches 28 are shaded in FIG. 2B to visually distinguish the patches 28 from the branches 30. Each branch 30 has a branch length ($L_B$) oriented in the direction of spacing of the adjacent patches 28 connected by the branch 30. That is, a branch 30 connecting two patches spaced in the x-direction has its branch length ($L_B$) oriented in the x-direction, and a branch 30 connecting two patches spaced in the y-direction has its patch length ($L_B$) oriented in the y-direction. The patches 28 are uniformly spaced, with a spacing (s) equal to the branch length ($L_B$). Because the openings 29 are partially defined by the spacing between patches 28, the openings 29 have a width equal to the spacing (s) between patches. The branches 30 occupy significantly less surface area than the patches 28 as a result of the smaller dimensions of the branches 30. In one embodiment, each branch 30 has a surface area in an XY plane of less than about 15 percent of the surface area of either of the adjacent patches.

Figure 3:
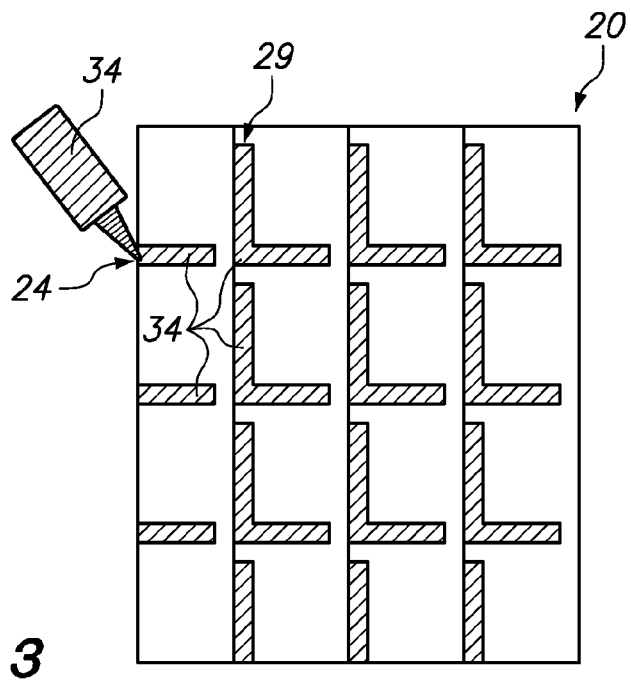
FIG. 3 is top view of the heatsink base illustrating the addition of a thermally-conductive, electrically non-conductive filler within the openings.

FIG. 3 is a top view of the heatsink base 20 illustrating the addition of a thermally-conductive, electrically non-conductive filler 34 within the openings 29. The thermal conductivity of the filler 34 allows heat to be efficiently transferred from patch 28 to patch 28, throughout the heatsink base 20. The electrical non-conductivity of the filler 34, however, ensures that the electrical properties of the EBG structure are not appreciably altered by the presence of the filler 34. Since the binder 26 used to couple the heatsink fins 42 to the heatsink base 20 (See FIG. 1) and the filler 34 are both required to be thermally-conductive and electrically non-conductive, the filler 34 and the binder 26 may be selected as the same material. For example, an epoxy compound may be used as both the binder 26, to bond the cooling fins to the heatsink base 20, and as a filler 34, to fill the openings 29 in the heatsink base 20.

Figure 4A:
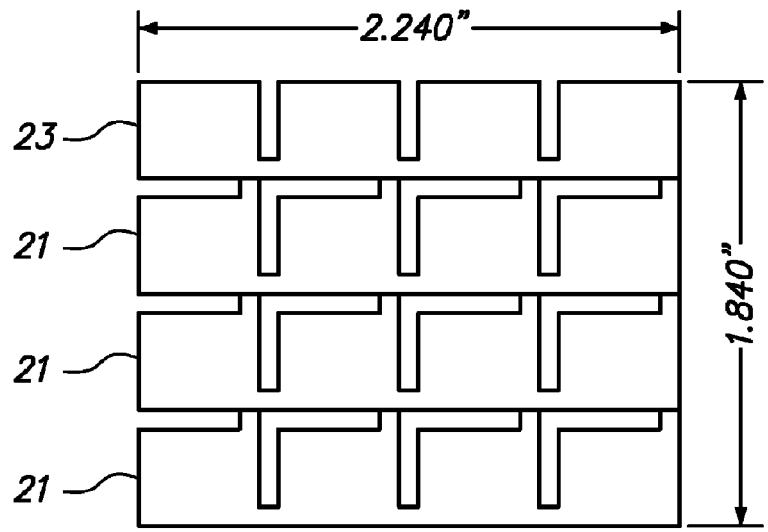
FIG. 4A is a dimensioned top view of the heatsink base according to one specific example embodiment.
Figure 4B:
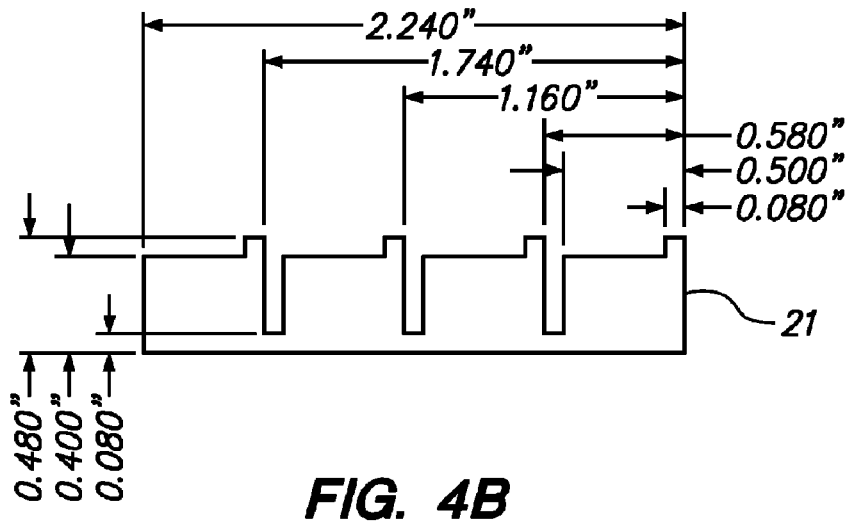
FIG. 4B is a dimensioned top view of a first portion of the heatsink base of FIG. 4A.
Figure 4C:
FIG. 4C is a dimensioned top view of a second portion of the heatsink base of FIG. 4A.

FIG. 4A is a dimensioned top view of the heatsink base 20 according to one specific example embodiment. The heatsink base 20 includes three of a first portion 21 and one of a second portion 23. FIG. 4B is a dimensioned top view of the first portion 21 of the heatsink base of FIG. 4A. FIG. 4C is a dimensioned top view of the second portion 23 of the heatsink base of FIG. 4A. The heatsink base 20 of FIG. 4A may be formed from a single piece of material by machining the heatsink base 20 according to the dimensions of FIGS. 4A, 4B, and 4C. Alternatively, the heatsink base 20 of FIG. 4A may be constructed by separately forming three of the first portion 21 and one of the second portion 23, and subsequently joining the portions 21, 23 (e.g. by welding or brazing) as shown in FIG. 4A.

Figure 5A:
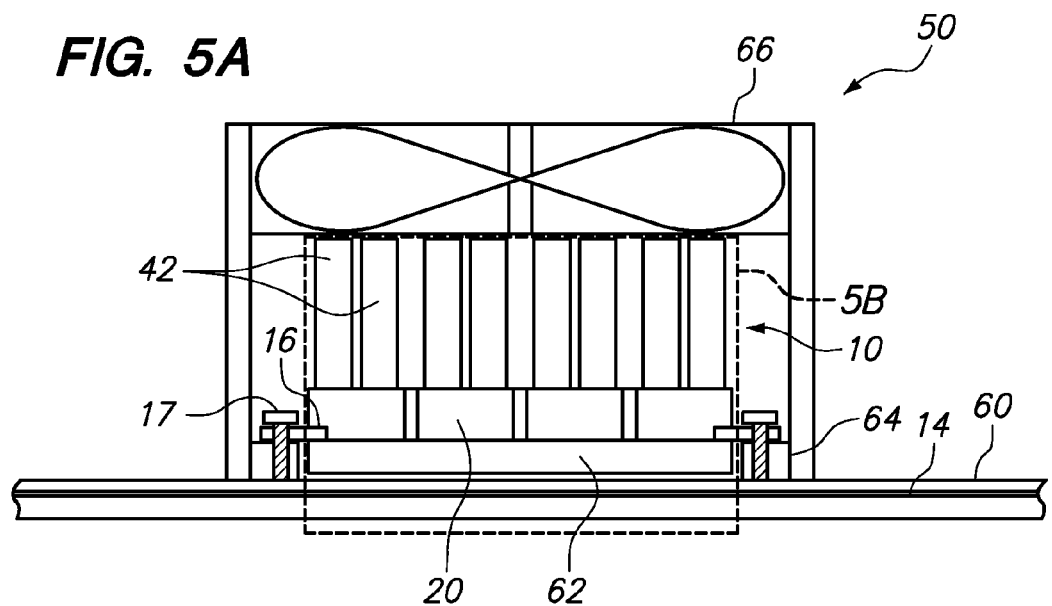
FIG. 5A is a side view of an electronic device incorporating the heatsink for cooling a CPU.

FIG. 5A is a side view of an electronic device 50 incorporating the heatsink 10 for cooling a microprocessor ("processor"), which in this example is a central processing unit (CPU) 62 on a system board 60. The CPU 62 is positioned in a socket 64 on the system board 60. Prior to securing the heatsink assembly 10 to the system board 60, the CPU 62 is positioned loosely in the socket 64. The heatsink 10 is secured at the mounting tabs 16 using conventional hardware 17, e.g. ungrounded metal posts, which firmly engages the heatsink base 20 of the heatsink 10 with the CPU 62. Heat generated by the CPU 62 is thereby transferred by conduction from the CPU 62 to the heatsink 10. A fan 66 is mounted to the system board 60 to generate airflow through the cooling fins 42 to cool the heatsink 10 by forced convection. Accordingly, the heatsink cools the CPU 62.

Figure 5B:
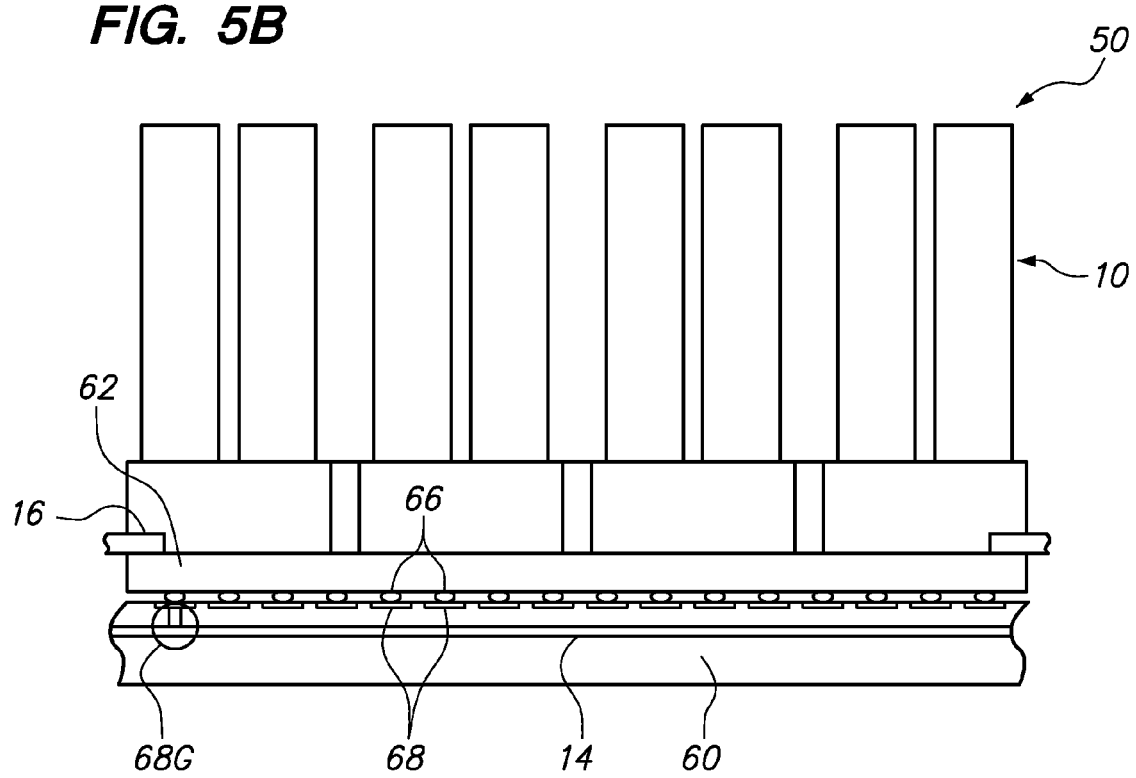
FIG. 5B is an enlarged, detail view of a portion of the electronic device of FIG. 5A.

FIG. 5B is an enlarged, detail view of a portion of the electronic device 50 highlighted in FIG. 5A. The CPU 62 has electrical contacts 66 (such as a land grid array) matched to mating electrical contacts 68 on an upwardly facing surface of the system board 60, which allow the CPU 62 to interface with the system board 60. The metal layer 14 in this example is a ground layer 14 of the system board 60. The CPU is grounded to at least one ground contact 68G. The CPU 62 is likely to generate EMI in the electronic device 50 because of the large amount of current the CPU 62 draws. The core frequencies of many ICs (such as CPUs) are often in the same range as the first few resonant modes of the cavity formed by the heatsink base and the circuit board's reference plane. Here, a cavity resonance effect may therefore occur in the small gap between the heatsink base 20 and the metal ground layer 14. When using conventional heatsinks, the cavity resonance effect amplifies the EMI at the specific resonant frequencies. However, the metal ground layer 14 and the periodically-patterned aspect of the heatsink base 20, together, form an EBG structure having a characteristic stopband that reduces certain frequencies of EMI. As noted above, the stopband may be tuned through selection of the physical parameters of the heatsink base to achieve a target stopband. The target stopband may be selected, for example, to reduce peak frequencies.

Figure 6:
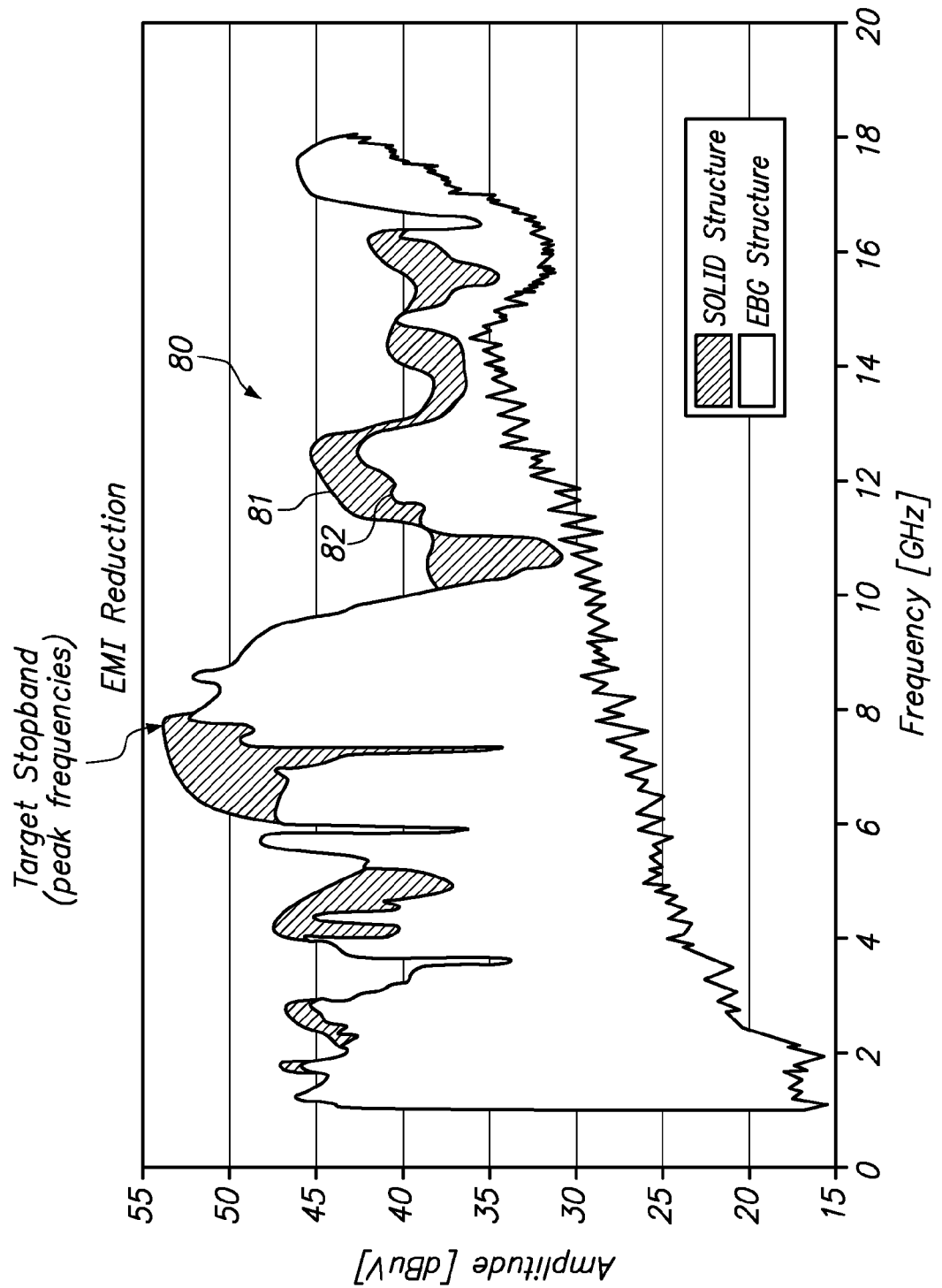
FIG. 6 is a graph illustrating the reduction in EMI resulting from using a periodically patterned heatsink base according to an embodiment of the invention, as compared with a conventional, solid heatsink base.

FIG. 6 is a graph 80 illustrating the reduction in EMI resulting from using a periodically patterned heatsink base 20 according to an embodiment of the invention, as compared with a conventional, solid heatsink base. The graph 80 includes a first frequency plot bounded by an upper curve 81 and a second frequency plot bounded by a lower curve 82. The upper curve 81 represents the frequency response over a range of frequencies using a solid heatsink base, while the lower curve 82 represents the frequency response over the same range of frequencies using a periodically patterned heatsink base. The prototype heatsink base was made of 0.25 inch thick copper, and it had a 4×4 array of patches that are 500 mils by 400 mils each. The branches connecting the patches were 80 mils by 80 mils. Target stopband regions are indicated from about 4 to 5 GHz, 6 to 8 GHz, and 10 to 16 GHz. The geometry and physical parameters of the periodically-patterned heatsink base have been selected to reduce the peak frequencies in this frequency range. As is evident in the graph 80, the peak frequencies are significantly lower as a result of using the periodically-patterned heatsink base as opposed to the conventional heatsink base. As a result of using the periodically-patterned heatsink base, the propagation of EMI is significantly reduced.

In the example of FIG. 6, the target stopband was selected to reduce peak frequencies. However, in any given device, the peak frequencies produced by a processor are not necessarily the frequencies that would interfere most with other circuits. Thus, the target stopband does not necessarily include the peak frequencies in every application.

Figure 7:
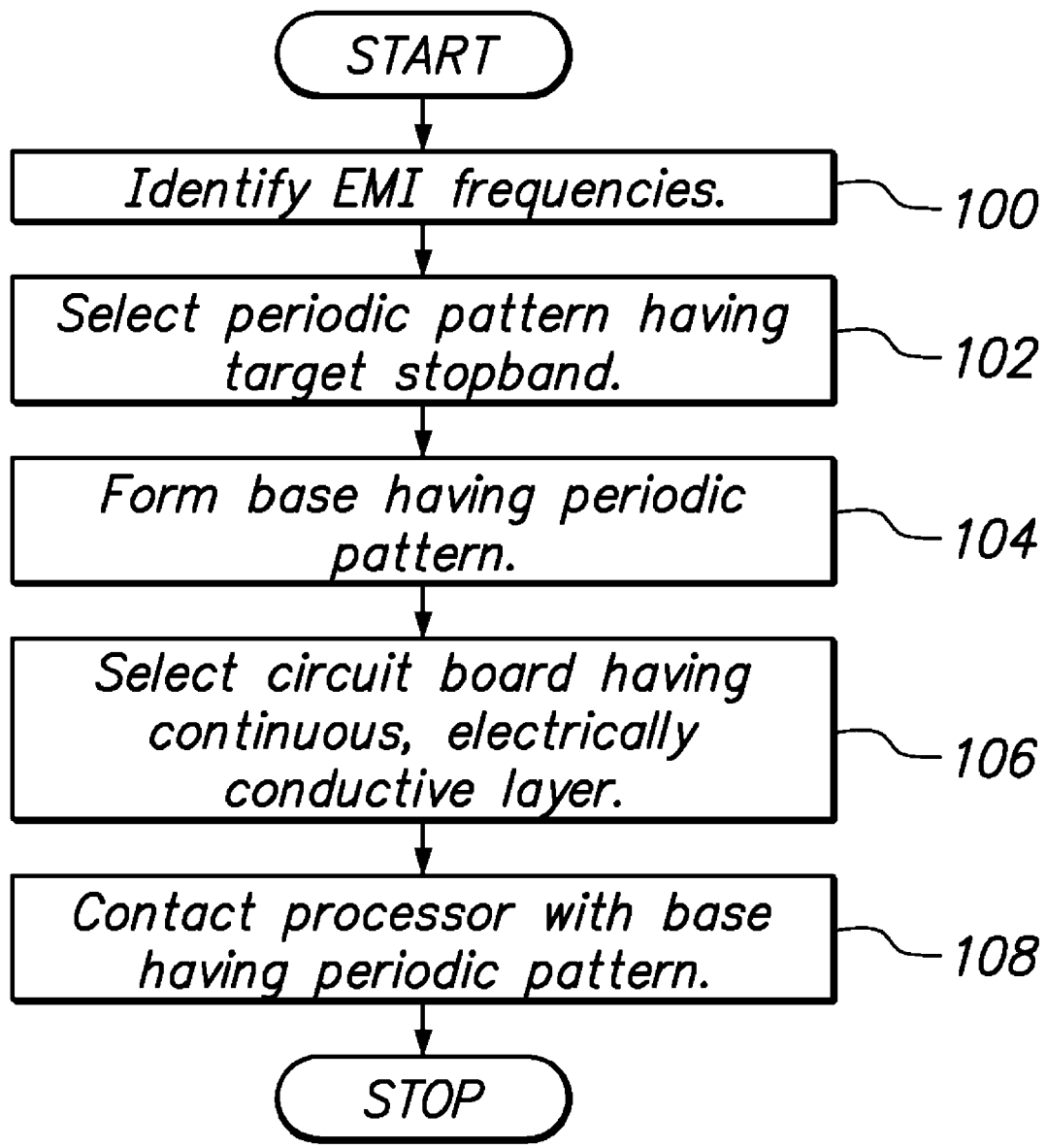
FIG. 7 is a flowchart outlining a method of reducing the propagation of electromagnetic noise generated by a processor on a circuit board according to an embodiment of the invention.

FIG. 7 is a flowchart outlining a method of reducing the propagation of electromagnetic noise generated by a processor on a circuit board according to an embodiment of the invention. Step 100 involves identifying a frequency band of the electromagnetic noise generated by the processor. The selected frequency band may be selected in view of the peak EMI frequencies generated by the processor and/or in view of the operational frequency of other devices (particularly analog devices) on the circuit board. Step 102 involves selecting a periodic pattern of spaced-apart patches interconnected by branches with geometry and physical parameters selected to achieve a target stopband within the identified frequency band. The size, shape, and spacing of the conductive patches all influence the actual stopband achieved by the periodically patterned structure of the heatsink base. The step of selecting a periodic pattern may include selecting a patch width, a patch length, a branch width, a branch length, a base thickness, or combinations thereof. The general relationship between physical dimensions of a square shaped EBG structure (i.e. $L_P=W_P$) and location of first resonant frequency is given as follow:

$$f_r = \frac{c}{2A\sqrt{\varepsilon_{eff}}}, \quad \text{(equation 1)}$$

where $A=W_B+L_P$ corresponds to the sum of spacing between individual EBG elements and its dimension (i.e. width or length). Here, $C=3*10^8$ m/s and denotes the speed of light in free space, and $\varepsilon_{eff}$ represents the effective dielectric of the media. Taking into account the contributions of the interconnecting branches, and assuming $W_P=L_P$ and $W_B=L_B$, this expression transforms into:

$$f_r = \frac{c}{W_B\sqrt{\varepsilon_{eff}}}(2W_B+L_P) \quad \text{(equation 2)}$$

In the case of a rectangular shaped structure, all other subsequent stopband locations can be theoretically determined by substituting $L_P$ for additional length of the EBG patches and combinations of those lengths.

In step 104, the heatsink base may be formed according to the periodic pattern selected in step 102. In step 106, a circuit board is selected, having a continuous, electrically-conductive layer. The layer formed may be a metal layer, such as a ground plane or power plane of a layered circuit board. The circuit board will typically include a processor, along with other digital and/or analog circuits. In step 108, the periodically-patterned heatsink base is secured in thermal contact with the processor. Together, the periodically patterned heatsink base and the metal layer form an EBG structure that reduces the amplitude of EMI in the selected stopband range of frequencies.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heatsink, comprising:
  a base having a periodically patterned structure comprising an array of electrically-conductive, thermally-conductive patches spaced apart in two dimensions of a reference plane and having a thickness perpendicular to the reference plane;
  a plurality of branches structurally connecting the patches, each branch connecting adjacent patches and having a width in the reference plane of less than a width of each adjacent patch; and
  a plurality of thermally conductive cooling fins coupled to the base and extending normal to the reference plane.

2. The heatsink of claim 1, wherein a cross-section of the periodically-patterned structure is constant in a direction normal to the reference plane.

3. The heatsink of claim 1, further comprising:
  a thermally conductive, electrically non-conductive filler filling the spaces between the adjacent patches.

4. The heatsink of claim 1, wherein the patches have an electrical conductivity coefficient of at least 10^7 S/m and a thermal conductivity coefficient of greater than 1 W/m*K.

5. The heatsink of claim 1, further comprising:
  a thermally-conductive, electrically non-conductive binder coupling the cooling fins to a surface of the base.

6. The heatsink of claim 1, wherein the cooling fins are thermally-conductive and electrically non-conductive.

7. The heatsink of claim 1, wherein each branch has a surface area of less than about 15 percent of the surface area of either of the adjacent patches in the reference plane.

8. The heatsink of claim 1, wherein the periodically patterned structure and the branches share common first and second opposing surfaces.

9. An apparatus comprising:
  a printed circuit board including a continuous, electrically-conductive layer;

a processor physically coupled to the printed circuit board and electrically coupled to the electrically-conductive layer; and a heatsink coupled to the circuit board in thermal contact with the processor, the heatsink including a base having a periodically patterned structure comprising an array of electrically-conductive, thermally-conductive patches spaced apart in two dimensions of a reference plane that is parallel to the conductive layer and having a thickness perpendicular to the conductive layer, a plurality of branches structurally connecting the patches, each branch spanning an opening between two adjacent patches and having a width in the reference plane of less than a width of each adjacent patch, and a plurality of thermally conductive cooling fins coupled to the base and extending perpendicular to the reference plane.

10. The apparatus of claim 9, wherein the conductive layer of the printed circuit board is a ground plane.

11. The apparatus of claim 10, further comprising:
a plurality of metal posts securing the processor to the circuit board, wherein the metal posts are not grounded to the ground layer.

12. The apparatus of claim 9, further comprising a thermally-conductive, electrically non-conductive binder coupling the cooling fins to the base.

13. The apparatus of claim 9, wherein the periodically-patterned structure has a substantially constant cross-section taken parallel to the reference plane.

14. The apparatus of claim 9, further comprising:
a thermally conductive, electrically non-conductive filler filling the spaces between the adjacent patches.

15. The apparatus of claim 9, wherein the patches have an electrical conductivity coefficient of at least $10^7$ S/m and a thermal conductivity coefficient of greater than 1 W/m*K.

16. The apparatus of claim 9, wherein the thermally-conductive, electrically non-conductive binder comprises an epoxy.

17. The apparatus of claim 9, wherein each branch has a surface area of less than about 15 percent of the surface area of either of the adjacent patches.

18. The apparatus of claim 9, wherein the periodically patterned structure and the branches share common first and second opposing planar surfaces.

19. A method of reducing the propagation of electromagnetic noise generated by an integrated circuit, comprising:
identifying a frequency band of the electromagnetic noise generated by the integrated circuit;
selecting a periodic pattern of spaced apart patches interconnected by branches with geometry having stopband within the identified frequency band; and
thermally contacting the integrated circuit with a heatsink having a base that includes an electrically-conductive, thermally-conductive material having the selected periodic pattern.

20. The method of claim 19, wherein the step of selecting a periodic pattern of spaced apart patches interconnected by branches with geometry having stopband within the identified frequency band comprises selecting one or more of the group consisting of a patch width, a patch length, a branch width, a branch length, and a base thickness.

* * * * *